United States Patent [19]

Hatkevitz et al.

[11] Patent Number: 4,931,134

[45] Date of Patent: Jun. 5, 1990

[54] METHOD OF USING LASER ROUTING TO FORM A RIGID/FLEX CIRCUIT BOARD

[75] Inventors: Zvi Hatkevitz, Andover; Ken Maylor, Danvers; Roland Jacques, Lowell, all of Mass.

[73] Assignee: Parlex Corporation, Methuen, Mass.

[21] Appl. No.: 394,065

[22] Filed: Aug. 15, 1989

[51] Int. Cl.$^5$ .................. B44C 1/22; B29C 37/00; C03C 15/00; C23F 1/02

[52] U.S. Cl. .................. 156/630; 29/846; 156/633; 156/643; 156/645; 156/655; 156/668; 156/150; 156/272.8; 156/902; 219/121.69; 219/121.85; 174/254; 427/96; 428/209; 428/901

[58] Field of Search .......... 156/629, 630, 633, 634, 156/643, 645, 655, 656, 659.1, 666, 668, 901, 902, 150, 272.8; 29/846, 852; 427/53.1, 96, 97, 98; 174/68.5; 428/209, 601, 901; 219/121.68, 121.69, 121.85

[56] References Cited

U.S. PATENT DOCUMENTS

| | | | |
|---|---|---|---|
| 4,254,445 | 3/1981 | Ho | 361/392 |
| 4,338,149 | 7/1982 | Quaschner | 156/248 |
| 4,417,393 | 11/1983 | Becker | 29/846 |
| 4,426,773 | 1/1984 | Hargis | 29/832 |
| 4,487,993 | 12/1984 | Becker | 174/68.5 |
| 4,631,100 | 12/1986 | Pellegrino | 156/150 |
| 4,632,845 | 12/1986 | Obstfelder et al. | 427/96 |
| 4,661,181 | 4/1987 | Camps et al. | 156/89 |
| 4,680,557 | 7/1987 | Compton | 333/1 |
| 4,700,214 | 10/1987 | Johnson | 357/68 |
| 4,720,470 | 1/1988 | Johnson | 437/173 |
| 4,792,779 | 12/1988 | Pond et al. | 338/195 |

Primary Examiner—William A. Powell
Attorney, Agent, or Firm—Weingarten, Schurgin, Gagnebin & Hayes

[57] ABSTRACT

A method of fabricating a multilayer circuit board having rigid and flexible sections using Z-axis laser routing. A rigid superstructure is provided for lamination to a flexible circuit substrate, wherein the superstructure includes specially configured strips of laser reflective material, disposed on the laminating surface thereof, defining the boundary between the rigid and flexible sections of the multilayer circuit board. In subsequent processing, a beam of laser energy is directed through the rigid superstructure, along the Z-axis thereof, superjacent to each strip of laser reflective material, thereby cutting through the material of the superstructure creating a laser routed channel which forms an interface between the rigid and flexible sections of the finished multilayer circuit board. In a further step, the portion of the rigid superstructure residing between the laser routed channels is separated and removed, there by exposing the underlying flexible substrate, resulting in a flexible section on an otherwise rigid laminated composite and creating a multilayer rigid/flex circuit board.

10 Claims, 2 Drawing Sheets

METHOD OF USING LASER ROUTING TO FORM A RIGID/FLEX CIRCUIT BOARD

FIELD OF THE INVENTION

This invention relates generally to the fabrication of circuit boards and more specifically to a method of fabricating multilayer circuit boards having rigid and flexible sections.

BACKGROUND OF THE INVENTION

Circuit boards consisting of rigid and flexible sections are commonly used in the electronics industry to provide a reliable platform for mounting and interconnecting electronic components and circuitry. Such rigid/flex circuit boards alleviate problems associated with rigid circuit boards such as broken circuit connections due to vibrations or other mechanical stresses related to transporting and positioning of the circuit board.

During the process of manufacturing circuit boards, it is particularly useful to work with a rigid board in order to etch conductor lines and otherwise build up the circuit board. Thus, in order to produce a rigid/flex circuit board, rigid and flexible layers are commonly structured in such a way as to form a preparatory rigid composite which may be processed to form a unitary multilayer circuit board comprising both rigid and flexible sections. Typically, such multilayer rigid/flex circuit boards are produced by laminating a superstructure comprising rigid insulative boards to a substrate comprising individual flexible layers such that the superstructure forms the outermost layers of a rigid laminate composite. Subsequently selective portions of the rigid superstructure are severed and removed from the laminate composite to expose selective areas of the flexible substrate. These areas of exposed flexible substrate form sections of the exterior surface of the finished multilayer circuit board which are, by definition, flexible relative to the areas of the laminate composite comprised of both flexible and rigid layers.

Various methods have been disclosed to facilitate the described process of severing and removing selective portions of a rigid external layer in a laminate composite comprising rigid and flexible layers to produce a unitary rigid/flex circuit board. For example, U.S. Pat. No. 4,338,149 discloses a method in which a rigid layer is pre-cut along lines defining the area which is to be flexible in the finished circuit board. In that patent, the pre-cut rigid layer is laminated between a flexible substrate on one side and a support layer on the other side and the final rigid/flex circuit board is formed by severing the support layer along the pre-cut lines of the underlying rigid layer, subsequently removing the combination of the pre-cut portion of the rigid layer and the severed support layer.

The pre-cutting procedure of the prior art involves extra manufacturing processes which are tedious and time-consuming. In order to produce the original rigid circuit board, the manufacturer must initially provide a pre-cut rigid layer for lamination between a flexible substrate and a superfluous support layer. After the rigid circuit board including the pre-cut underlying layer is produced, an additional cutting step, which may be accomplished by the use of a laser, must be undertaken to sever the support layer at a position corresponding to the cuts in the underlying rigid layer in order to ultimately remove the rigid layer from the rigid laminate composite and to create a flexible section on the finished multilayer circuit board.

Previous inventions have suggested that laser technology could be useful in the manufacture of printed circuit boards. For example, U.S. Pat. No. 4,631,100 discloses a method for using a laser to open undesired conductive interconnects for forming predetermined circuit patterns on printed circuit boards. Likewise, U.S. Pat. No. 4,426,773 also contemplates the use of a laser to isolate electrically conductive traces. In yet another invention related to the fabrication of printed circuit boards (U.S. Pat. No. 4,417,393), a laser is used to form channels in dielectric and/or insulative substrates for creating conductive paths therein. Indeed, the use of a laser is contemplated for cutting the support layer of previously referenced U.S. Pat. No. 4,338,149 to produce rigid/flex circuit boards. The present invention provides a novel method for using a laser in conjunction with specially configured strips of laser reflective material to produce rigid/flex circuit boards.

SUMMARY OF THE INVENTION

In the present invention, a multilayer circuit board comprising rigid and flexible sections is produced by a method utilizing Z-axis laser routing to separate a rigid superstructure from an underlying flexible substrate in a laminate composite. Initially, a flexible substrate comprising at least one layer of flexible circuit material including conductor paths and/or electronic circuitry is provided for lamination to a rigid superstructure which forms the outermost layers of a laminate composite. The superstructure is comprised of a rigid insulative substance having strips of laser reflective material disposed on the laminating surfaces thereof.

The strips of laser reflective material are specifically configured to define the boundary between the sections of the multilayer circuit board designated to be rigid and those designated to be flexible. In subsequent processing, a beam of laser energy is directed through the rigid superstructure, along the Z-axis superjacent to each strip of laser reflective material, such that the laser reflective material reflects the beam of laser energy back through the superstructure, forming a laser routed channel therethrough. Each laser routed channel provides an interface between the rigid and flexible sections of the multilayer circuit board. In a further step, selective portions of the superstructure residing between the laser routed channels is separated and removed from the laminate composite thereby exposing the underlying flexible substrate, producing a flexible section on the otherwise rigid laminate composite and creating a rigid/flex multilayer circuit board.

The use of strips of laser reflective material as described above also serves a second function in that the strips prevent the flow of laminating adhesive onto the sections of the laminate composite which are designated to be flexible in the finished circuit board. By selectively applying the adhesive used to laminate the rigid superstructure to the flexible substrate in the areas designated to be rigid, the adhesive can be prevented from flowing into the sections designated to be flexible by the strips of laser reflective material. The absence of adhesive material in the sections designated to be flexible facilitates the process of removing a portion of the superstructure from the laminate composite.

The laser cutting process described herein can be automated by the use of computer aided manufacturing to provide for mass production of rigid/flex circuit boards. The use of laser reflective material eliminates the requirement for precise adjustment of the laser penetration level which would be necessary to prevent the underlying flexible substrate from being affected. Thus, the present invention provides an efficient and advantageous process for creating rigid/flex circuit boards.

DESCRIPTION OF THE DRAWINGS

The invention will become more fully understood from the following detailed description taken in conjunction with the accompanying drawings, in which.

DETAILED DESCRIPTION OF THE INVENTION

Figure 1:
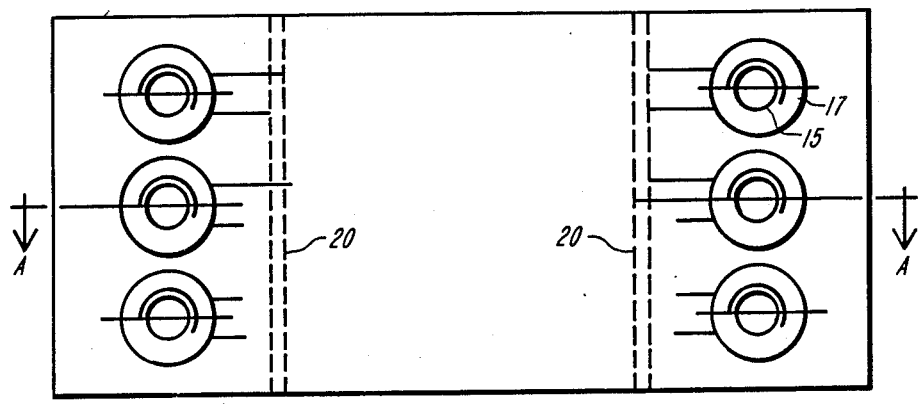
FIG. 1 is a top view of the laminate composite provided for producing the multilayer circuit board of the present invention.
Figure 2:
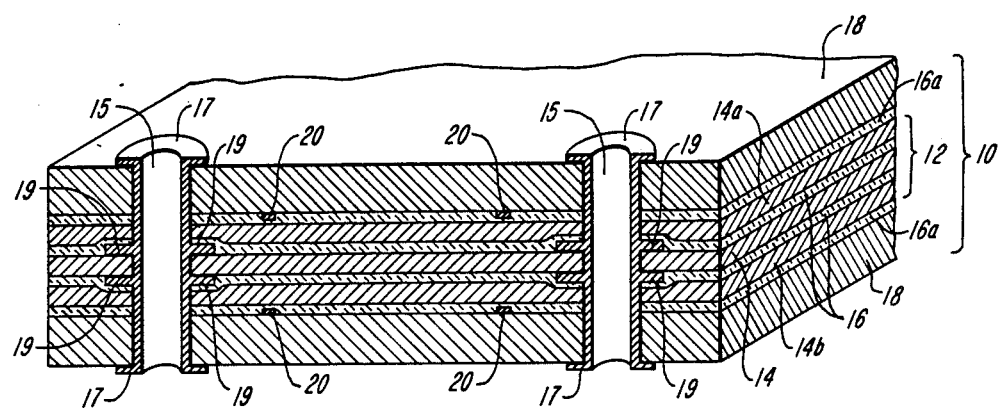
FIG. 2 is a cross-sectional view of the laminate composite of FIG. 1 taken along section line A—A.

Referring now to FIGS. 1 and 2, a laminate composite 10 is shown, generally comprising a flexible substrate 12 having conductor paths and/or electric circuitry disposed therein, interposed between layers of a rigid superstructure 18. The multilayer circuit board 10 also comprises a plurality of through holes 15, arranged in a matrix array, as shown in FIG. 1, for mounting electrical components. These through holes 15, can be plated to include external and internal lands 17, 19, respectively, for creating electrical connection between mounted components (not shown) and the conductor paths and/or electronic circuitry of the flexible substrate 12. The laminate composite of FIG. 2 further comprising at least one strip 20 of laser reflective material specifically positioned between flexible substrate 12 and rigid superstructure 18 for Z-axis laser routing according to the present invention.

The flexible substrate 12 comprises at least one flexible layer 14 which may have a plurality of additional flexible layers 14a, 14b laminated thereto. Each flexible layer comprises conductor paths and/or electronic circuitry and may be further comprised of a polyimide material such as Kapton, selected for its flexibility, insulation, and heat resistance characteristics. Disposed between each flexible layer 14, 14a, 14b of the flexible substrate 12 are adhesive layers 16 which may comprise a glass cloth with semi-cured resin, molded under heat and pressure for bonding adjacent flexible layers 14, 14a, 14b to one another, making up the flexible substrate.

The rigid superstructure 18 is laminated to the outermost surfaces of the flexible substrate 12 by way of additional outermost adhesive layers 16a to form the laminate composite 10. Disposed on each laminating surface of the rigid superstructure 18 are strips 20 of laser reflective material, such as copper, specifically configured to define the boundary delimiting the rigid and the flexible sections of the finished multilayer circuit board.

The strips 20 of laser reflective material are created by generating special artwork which follows the contour of a predetermined rigid/flex interface. The artwork is then used to create the desired reflective strips 20 on the laminating surface of each rigid superstructure 18 by way of well known photoresist techniques. Thus, during the formation of the laminate composite 10, each strip 20 of laser reflective material is situated in the outermost adhesive layer 16a, in abutting relation to the outermost surface of the flexible substrate 12.

The laminate composite 10, having inlaid strips 20 of laser reflective material forms a preparatory rigid circuit board specifically configured for the Z-axis laser process of the present invention which can be easily transported and maneuvered for further processing and treatment such as imaging, etching, plating, drilling or other circuit build up. The inlaid strips 20 of laser reflective material serve a dual purpose as will be discussed in further detail herein below.

Figure 3A:
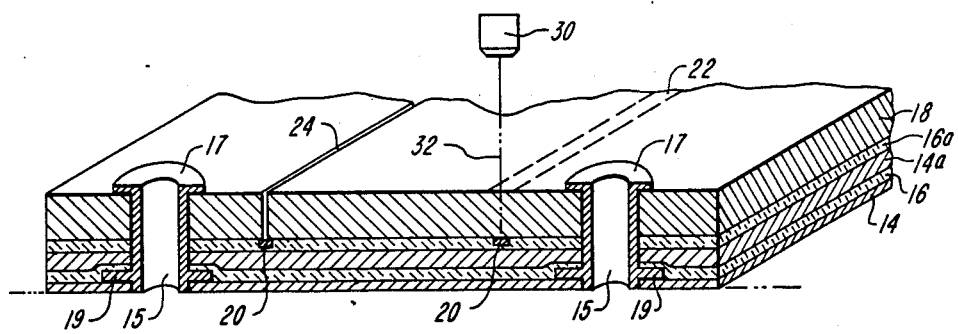
FIGS. 3A and 3B are cross-sectional views of the laminate composite of FIG. 1 taken along section line A—A, further depicting the laser routing method of the present invention.
Figure 3B:
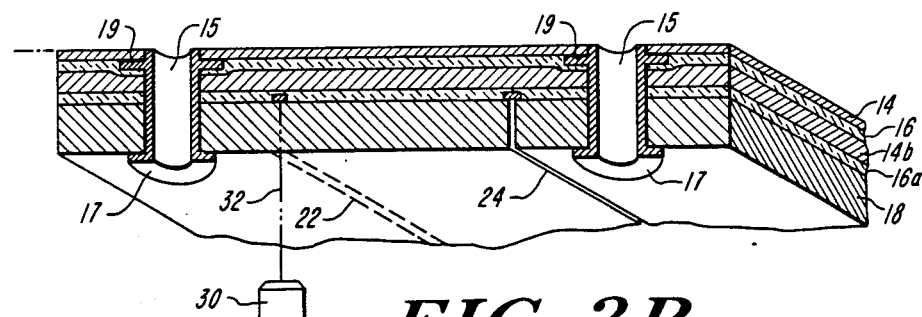

FIGS. 3A and 3B show the Z-axis laser routing method of the present invention, wherein a laser source 30, for example, 180 watt Carbon Dioxide Laser System, directs a beam of laser energy 32 through the rigid superstructure 18, along the Z-axis superjacent to the inlaid strips 20 of laser reflective material in alignment with pathway 22. FIGS. 3A and 3B show pathway 22 to be a straight line, however, it is to be understood that other, more complexly contoured pathways may be used depending on the application desired.

Figure 4:
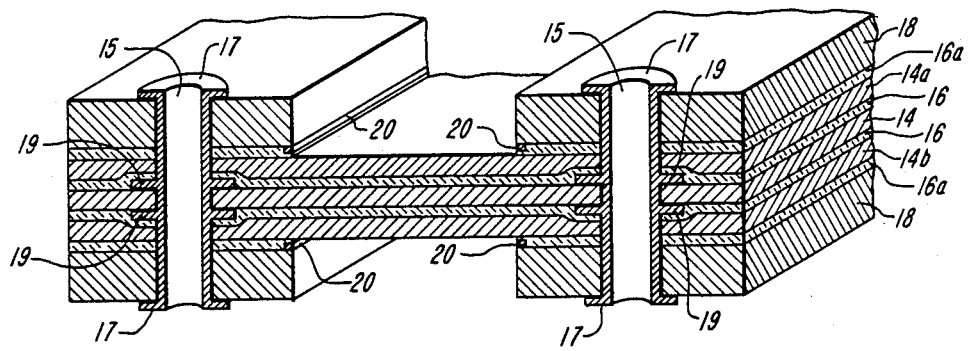
FIG. 4 is a cross-sectional view taken along section line A—A of the multilayer circuit board provided by the laser routing method of the present invention with a section of the rigid superstructure removed.

The beam of laser energy 32 cuts through the material of the rigid superstructure 18, typically approximately 0.005–0.015 inches in thickness, until it impinges upon the strip 20 of laser reflective material, typically approximately 0.030 inches in width. The strips 20 of laser reflective material function to reflect the beam of laser energy 32, thereby preventing the laser energy from affecting underlying layers of the flexible substrate 12. By guiding the laser source 30 along the length of each pathway 22, for example via computer aided manufacturing means, a laser routed channel 24 is created through the rigid superstructure 18, coincident with the configuration of the underlying strips 20 of laser reflective material. Finally, the material of the rigid superstructure 18 residing between the laser routed channels 24 is removed from the laminate composite 10, exposing the flexible layers below to form a multilayer circuit board having rigid and flexible sections, as shown in FIG. 4.

In the practice of the process of the present invention, the outermost adhesive layers 16a between the laminating surfaces of the flexible substrate 12 and the rigid superstructure 18 are applied only in the sections of the circuit board designated to be rigid. In this manner, when the rigid superstructure 18 is situated on the flexible substrate 12 for lamination thereto, the strips 20 of laser reflective material act as a dam to prevent the adhesive located in the areas to be rigid from flowing into the sections designated to be flexible. As a result, the outermost adhesive layers 16a are absent between the section of the rigid superstructure 18 to be removed and the underlying flexible substrate 12, thereby facilitating the removal of that portion of the rigid layer which lies in the section designated to be flexible. The internal adhesive layers 16 may be applied to the entire surface, or to increase flexibility, may be selectively applied similar to the outermost adhesive layers 16a.

Figure 5:
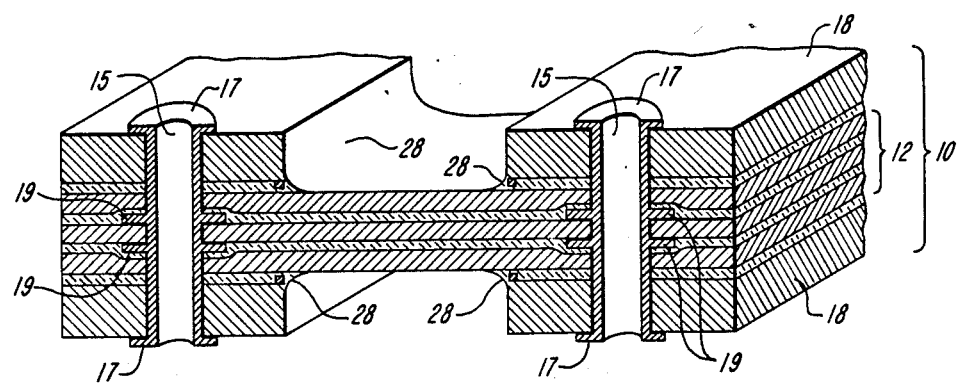
FIG. 5 is a cross-sectional view taken along section line A—A of the finished multilayer circuit board of the present invention including strain relief fillets.

After the multilayer circuit board has otherwise been completed by the process described above, the circuit board is cleaned by way of well known ultrasonic treatment techniques to dispose of any residue which may have been created during the Z-axis laser routing process. In a final step, the multilayer circuit board undergoes a filleting process whereby strain relief fillets 28 of epoxy are applied along the rigid/flex interfaces, as shown in FIG. 5, thereby insulating the exposed area of the reflective strips 20, and providing additional resilience and support in the finished multilayer circuit board.

A variety of modifications and variations of the present method are possible in light of the teachings set forth above. Therefore, the present invention is to be viewed as embracing each and every novel feature and novel combination of features present in, or possessed by the invention disclosed herein, limited solely by the scope and spirit of the appended claims.

What is claimed:

1. A method of fabricating a multilayer circuit board having rigid and flexible sections, by Z-axis laser routing, comprising the steps of:
   forming a rigid superstructure having a laminating surface and an opposing surface, said laminating surface having at least one strip of laser reflective material disposed thereon, said strips defining a boundary between the rigid and flexible sections of said multilayer circuit board;
   providing a flexible substrate for lamination to said rigid superstructure;
   applying an adhesive material to selective areas intermediate said rigid superstructure and the flexible substrate, said selective areas corresponding to a section designated to be rigid on said multilayer circuit board;
   laminating said rigid superstructure to the flexible substrate forming a rigid laminate composite, wherein said strips of laser reflective material abut the flexible substrate;
   directing laser energy at said rigid superstructure in alignment with said strips of laser reflective material, forming a laser routed channel through rigid superstructure terminating at said strip of laser reflective material, said channel defining an interface between said rigid and flexible sections on said multilayer circuit board; and
   removing selected sections of said rigid superstructure between said laser routed channels to expose selected sections of the flexible substrate, forming said multilayer circuit board having rigid and flexible sections.

2. A method of fabricating a multilayer circuit board as recited in claim 1, wherein said step of forming a rigid superstructure consists of the steps of:
   forming a mask to define the boundaries between the rigid and flexible segments of said multilayer circuit board;
   overlaying said mask on said laminating surface to form pathways thereon; and
   depositing laser reflective material along said pathways defined by overlaying said mask on said laminating surface.

3. A method of fabricating a multilayer circuit board as recited in claim 2, wherein said depositing step consists of chemical etching of laser reflective material.

4. A method of fabricating a multilayer circuit board as recited in claim 2, wherein said depositing step consists of electroless deposition of laser reflective material.

5. A method of fabricating a multilayer circuit board as recited in claim 2, wherein said depositing step consists of electrolytic deposition of laser reflective material.

6. A method of fabricating a multilayer circuit board as recited in claim 2, wherein said laser reflective material is copper.

7. A method of fabricating a multilayer circuit board as recited in claim 1, wherein said laser directing step consists of directing laser energy substancially along a Z-axis with respect to said rigid laminate composite.

8. A method of fabricating a multilayer circuit board as recited in claim 1, further including the step of:
   ultrasonically cleaning said multilayer circuit board to remove contaminants from the flexible sections thereof.

9. A method of fabricating a multilayer circuit board, as recited in claim 6, further including the step of:
   filleting said multilayer circuit board to insulate the exposed reflective strip and provide strain relief fillets at the interface between said rigid and flexible sections thereon.

10. A method of fabricating a multilayer circuit board, as recited in claim 7, wherein said strain relief fillet comprise epoxy.

* * * * *